United States Patent [19]

Amann et al.

[11] Patent Number: 5,008,893
[45] Date of Patent: Apr. 16, 1991

[54] TUNABLE SEMICONDUCTOR LASER

[75] Inventors: Markus-Christian Amann, Munich; Gerhard Baumann, Ottobrunn; Jochen Heinen, Haar; Wolfgang Thulke, Munich, all of Fed. Rep. of Germany

[73] Assignee: Siemens Aktiengesellschaft, Berlin and Munich, Fed. Rep. of Germany

[21] Appl. No.: 480,825

[22] Filed: Feb. 15, 1990

[30] Foreign Application Priority Data

Feb. 15, 1989 [EP] European Pat. Off. ........ 89102596.7

[51] Int. Cl.$^5$ .............................................. H01S 3/19
[52] U.S. Cl. ..................................... 372/50; 372/20; 372/46; 372/96
[58] Field of Search ................... 372/20, 50, 45, 46, 372/48, 96

[56] References Cited

U.S. PATENT DOCUMENTS

| 4,352,187 | 9/1982 | Amann | 372/46 |
| 4,607,370 | 8/1986 | Mukai et al. | 372/50 |
| 4,719,636 | 1/1988 | Yamaguchi | 372/20 |
| 4,802,187 | 1/1989 | Bouley et al. | 372/20 |
| 4,817,105 | 3/1989 | Yano | 372/20 |
| 4,823,352 | 4/1989 | Sugimoto | 372/20 |
| 4,920,542 | 4/1990 | Brosson et al. | 372/50 |

FOREIGN PATENT DOCUMENTS

| 0173269 | 3/1986 | European Pat. Off. . |
| 0296066 | 12/1988 | European Pat. Off. . |
| 0300790 | 1/1989 | European Pat. Off. . |

OTHER PUBLICATIONS

Fabrication and Characteristics of MCRW GaAs/-GaAlAs Lasers on Semiinsulating Substrate of Journal of Optical Communications of 1985, p. 42.
Japanese Patent Abstracts. vol. 13, No. 97, Mar. 7, 1989.

Primary Examiner—James W. Davie
Attorney, Agent, or Firm—Hill, Van Santen, Steadman & Simpson

[57] ABSTRACT

A tunable semiconductor laser which is formed on a substrate 2 which has a first contact 14 on one surface and a third contact 16 on the opposite surface so as to supply the operating current which is laterally limited to a laser-active stripe through a barrier layer 4 1 and including a second contact 15 on a ridge waveguide 11, 12, 13 so as to inject charge carriers into a tuning layer 9 mounted adjacent an active layer 6 and which is separated from the active layer by highly doped central layer 10 so as to allow tuning of the laser.

29 Claims, 3 Drawing Sheets

TUNABLE SEMICONDUCTOR LASER

BACKGROUND OF THE INVENTION

1. Field of the Invention

This invention relates in general to a tunable semiconductor laser and in particular to a laser which can be tuned over a relatively broad frequency range.

2. Description of the Prior Art

For optical communications semiconductor lasers are required wherein the wavelength of the emitted light can be varied within certain limits. This variation in wavelength should occur continuously and very rapidly at electronic speeds. It is desirable to obtain a laser which is tunable that can be manufactured at low cost and which does not change its properties over long operating times.

One possibility of tuning a laser by varying the wavelength is to vary the refractive index in a part of the light conducting semiconductor material by injecting charge carriers. So as to obtain tuning of the laser, a semiconductor laser is divided in two or more sections of different contact regions in the longitudinal directions and these sections are driven with different driving currents. At least one section is designed as a semiconductor laser. The tuning of the wavelength occurs by a variation of the effective refractive index in one or more of those regions which are not designed as semiconductor lasers. The adjustment of the currents through such sections can only occur within narrow limits since the variation of current through a section also influences the operating condition of the other sections. Thus, one disadvantage of the multisection lasers in addition to its complicated manufacturing requirements is the necessity of defining and optimizing the relationship of the various currents to each other on the basis of an extensive measuring program. Also, changes caused by aging to the multi-section laser require that the operating data be reobtained after certain operating times.

Also, for further prior art see U.S. Pat. Nos. 4,352,187, 4,607,370, European Patent Application No. 0 300 790, European Patent Application No. 0 173 269, European Patent Application No. 0 296 066, Article Entitled "Fabrication and Characteristics of MCRW GaAs/GaAlAs Lasers on Semiinsulating Substrate", 8177 Journal of Optical Communications 6(1985) June, No. 2, Berlin, Germany, Japanese Abstract Entitled "Semiconductor Light-Emitting Device" No. 63-272088 (A).

SUMMARY OF THE INVENTION

It is an object of the present invention to provide a simply manufacturable tunable semiconductor laser which can be simply tuned and which does not suffer a significant deterioration due to aging effects.

A tunable semiconductor laser is formed which has an active layer, a tuning layer and first, second and third contacts wherein an active layer and tuning layer are arranged adjacent each other on a substrate and the active layer and the tuning layer are separated by a central layer of semiconductor material which serves as a current conductor. The central layer has a thickness and is highly doped so as to obtain the desired charge carrier density and to maintain the electrical conductivity very high. A barrier layer 4 interrupted by a strip-shaped region is provided for a lateral limitation of the current conduction to the strip-shaped region. The tuning layer 9 is arranged on the side of the barrier layer opposite the side of the substrate. A first contact layer is applied to the tuning layer and a first contact is applied to the first contact layer. A ridge waveguide is formed according to the MCRW principle above that region in which the barrier region is interrupted and the ridge waveguide is formed by a stripe-shaped cladding layer and a second contact layer is applied to the cladding layer and a contact strip is applied to the second contact layer. Third contact is applied on the side of the barrier layer which is opposite the second contact. The cladding layer and the second contact layer are doped for electrical conduction and have a first conductivity type and the tuning layer 9 and the first contact layer 95, the central layer 10 and at least layered portions of the barrier layer are doped for a second electrical conductivity type.

Further other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
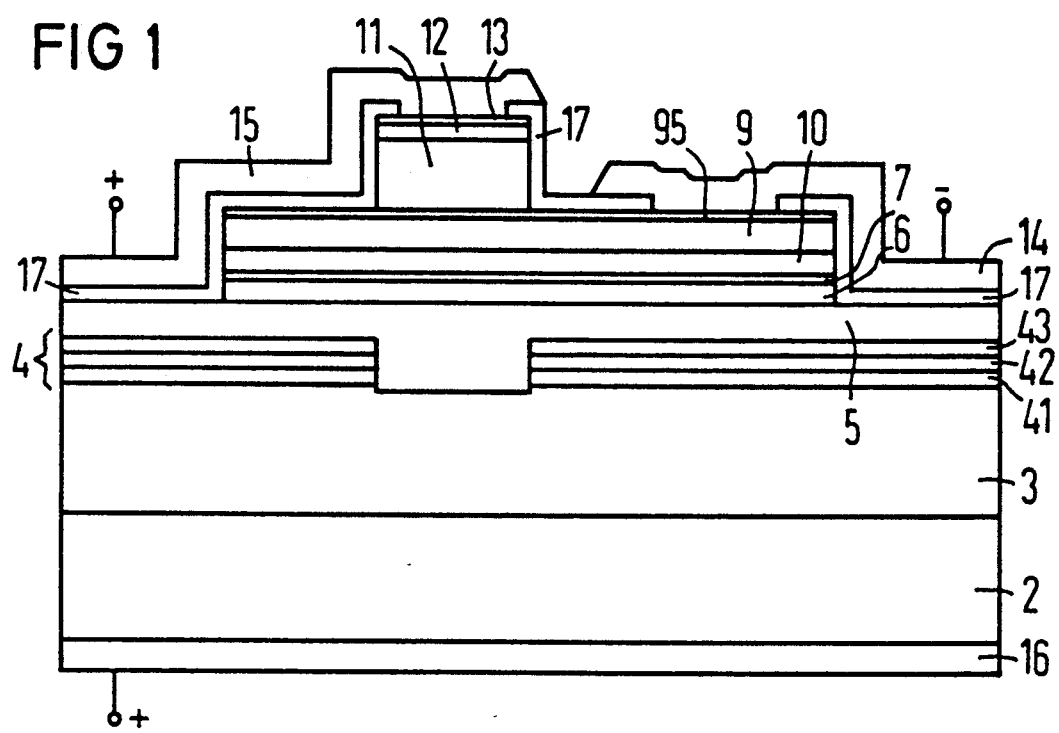
FIG. 1 is a sectional view illustrating a tunable semiconductor laser.

FIG. 1 illustrates in sectional view a MCRW (metal clad ridge waveguide) such as disclosed in U.S. Pat. No. 4,352,187 which disclosure is hereby incorporated by reference modified to incorporate the present invention. The means for lateral waveguide guidance so as to limit the radiation to a strip-shaped region occurs with a ridge of semiconductor material applied over the active zone and occurs laterally thereof in the cover layers which have been decreased in thickness.

In the semiconductor laser of the invention, the tuning of the emission wavelength occurs by setting the refractive index of a separate semiconductor layer of the tuning layer in the multiple heterostructure by injecting additional charge carriers. As contrasted to prior art structures having longitudinal arrangements of tuning sections, the tuning layer in the structure of the invention is arranged either above or below the active layer relative to FIG. 1.

So as to enable single mode and tunable operation, the laser structure of the invention can have a DFB lattice that like the tuning layer can lie above or below the active layer.

FIGS. 1-5 illustrate different exemplary embodiments all of which have in common a structure which is simple to manufacture that allows a separate electrical drive of the tuning layer. At the same time, the laser-active zone is limited to a stripe that is defined by a ridge waveguide. The exemplary embodiments are described for a substrate 2 which is doped for p-conduction. It is to be realized that opposite conductivity types can be utilized and the conductivity types of the grown on layers will also correspondingly change if the semiconductor conduction type is changed. The use of the p-type conduction for the substrate is used, but the invention is not limited to such structure.

So as to improve the surface quality of the semiconductor layer 2, a buffer layer 3 which also is doped p-type is grown onto substrate 2. Then a barrier layer 4 is formed on buffer layer 3 and is formed with an interruption or gap along a stripe-shaped region and the barrier layer 4 is n conductivity doped at least in portions of the surface. The barrier layer 4 limits the current conduction to the substrate to the stripe-shaped region in which the barrier layer 4 is interrupted. In the embodiments illustrated in FIGS. 1-5, the barrier layer 4 is respectively comprised of a first layer 41 and a second layer 42 and a third layer 43. The first layer 41 and the second layer 42 are each respectively n-doped and the third layer 43 is p-doped. A compensating layer 5 which has a p-conductivity is grown onto the barrier layer 4 and the compensating layer 5 fills out the strip-shaped region in which the barrier layer is interrupted and fills the strip-shaped trench in the buffer layer 3 that was formed when the barrier layer 4 was removed by etching.

An active layer 6 is formed on the side of the layer 5 which faces away from the substrate 2 and a protective layer 7 is formed over the active layer 6. A central layer 10 is formed over the protective layer 7 and a tuning layer 9 is formed over the layer 10 and a first contact layer 95 is formed on the tuning layer 9. Protective layer 7 serves only the purpose of preventing a mixing of the active layer 6 with the following layers during epitaxial growth and can be omitted if the next layer is grown from a vapor phase. A ridge waveguide is formed which comprises a cladding layer 11, a second contact layer 12 thereon and a contact strip 13 of metal on the second contact layer 12 above the strip-shaped region which was left uncovered by the barrier layer 4. A passivation layer 17 composed of a dielectric as, for example, an oxide layer is formed and leaves free a region of the first contact layer 95 and a region along the contact strip 13. Applied to the passivation layer 17 is a first contact 14 that contacts the first contact layer 95. A second contact 15 is formed in contact with the contact strip 13. A voltage for operation of the laser is applied between the first contact 14 and a third contact 16 attached to the opposite surface of the substrate 2. Charge carriers are injected into the tuning layer 9 with the second contact 15. The cladding layer 11 and the second contact layer 12 are doped for p-conduction and the second contact layer 12 is highly doped to provide low impedance to the contact strip 13. The tuning layer 9, the first contact layer 95 and the central layer 10 are "n" conductive doped and the first contact layer 95 is highly doped to provide low impedance to the first contact 14 and the central layer 10 is highly doped to allow high charge carrier density and charge carrier mobility.

If a semi-insulating substrate 2 is utilized, the third contact 16 is applied on the buffer layer 3. In the embodiment of FIG. 1, the active layer 6 which has a protective layer 7 is grown onto the compensating layer 5. This is followed by the central layer 10 and by the tuning layer 9. A DFB lattice can be integrated in the central layer 10.

Figure 2:
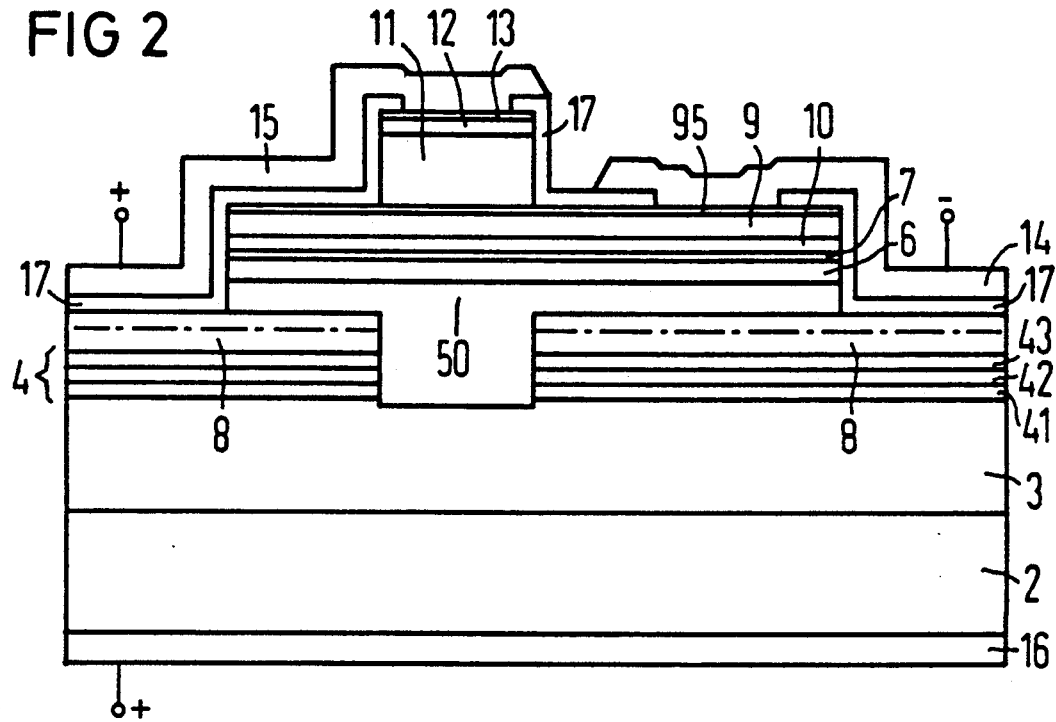
FIG. 2 is a sectional view illustrating a modified form of the invention.

FIG. 2 illustrates a modified form of the invention wherein an additional lattice layer 8 having a DFB is provided between the barrier layer and the compensating layer 50. The lattice extends perpendicular to the plane of the drawing. The sequence of the active layer 6, the protective layer 7, the tuning layer 9 and the first contact layer 95 is the same as that shown in FIG. 1, so the main difference is that the additional lattice layer 8 having a DFB lattice is provided between the barrier layer 4 and the compensating layer 50.

Figure 3:
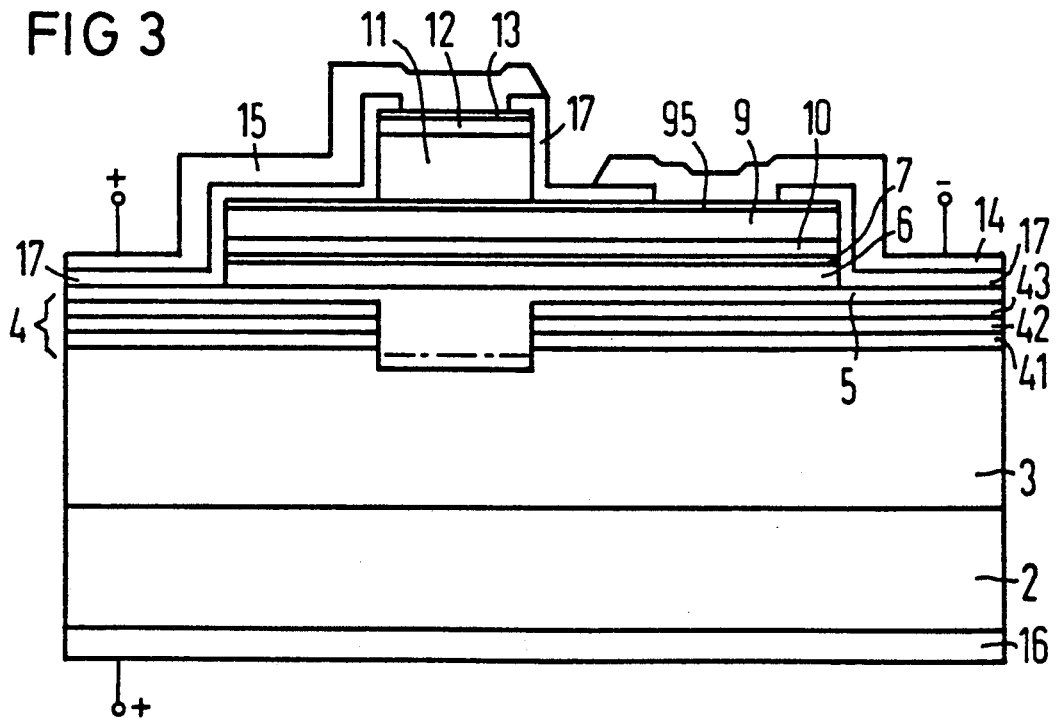
FIG. 3 is a sectional view illustrating a second modified form of the invention.

FIG. 3 illustrates a second modification of the structure of FIG. 1 wherein DFB lattice is formed in the buffer layer 3 in the region of the ridge waveguide. The DFB lattice is indicated by the dash dot line.

Figure 4:
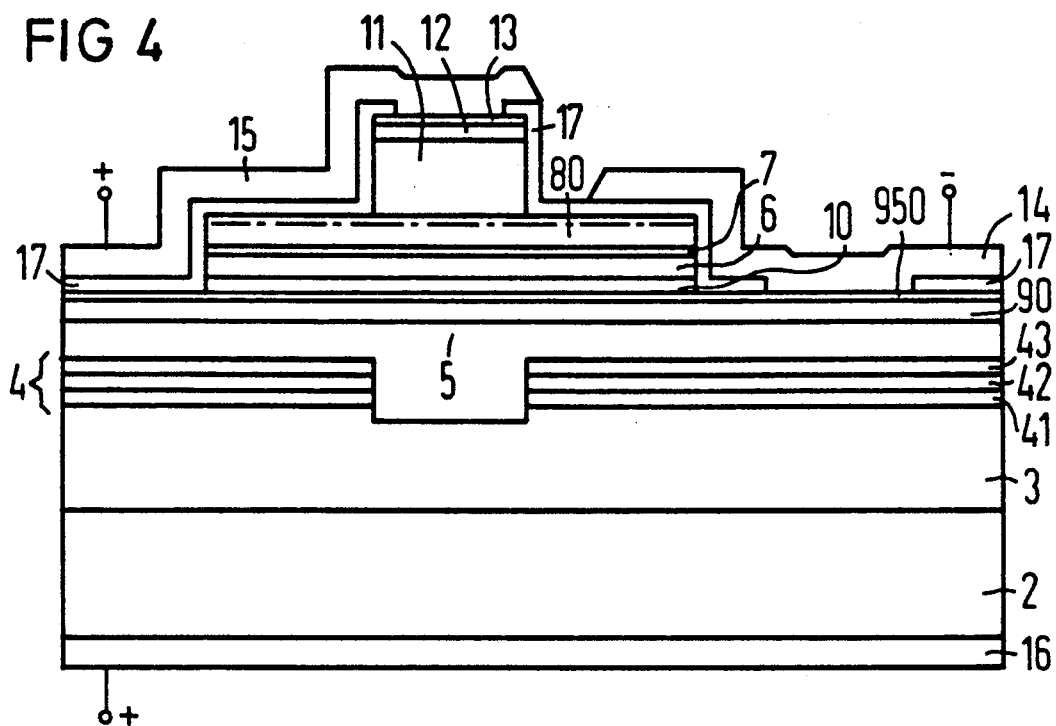
FIG. 4 is a sectional view illustrating a third modified form of the invention.

FIG. 4 illustrates a further embodiment of the invention in which a tuning layer 90 is grown over the surface of the compensating layer 5 and the first contact layer 950 is grown on the tuning layer 90. These are followed by the central layer 10, the active layer 6, the protective layer 7 and a lattice layer 80 which contains a DFB lattice.

Figure 5:
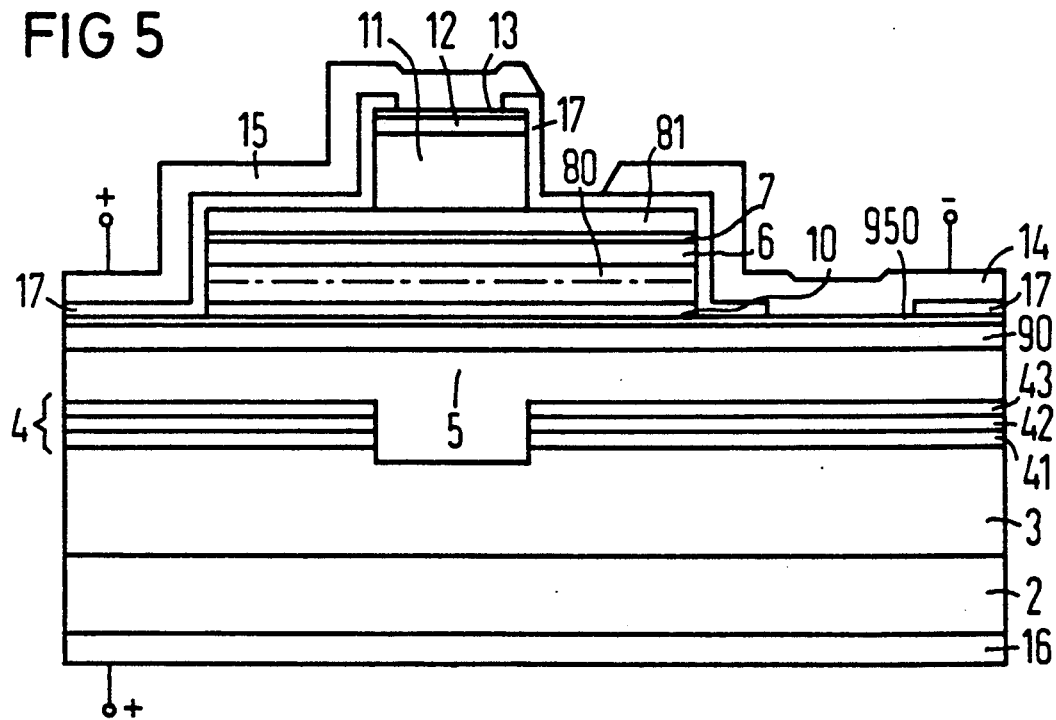
FIG. 5 is a sectional view illustrating a fourth modified form of the invention.

The embodiment of FIG. 5 has the same general construction as that shown in FIG. 4 except the lattice layer 80 is arranged between the central layer 10 and the active layer 6. An etching stop layer 81 is applied on the protective layer 7 and under the ridge waveguide.

So as to maintain the overall current conduction, the active layer 6 is laterally limited to a region that exceeds the widths of the ridge waveguide (a maximum of about 5 $\mu$m, preferably narrower) by about 2-20 $\mu$m.

An improved emission limitation to the region under the ridge can be achieved in that the first contact layer 95 in the exemplary embodiments of FIGS. 1-3 and the tuning layer 9 are at least partially, but potentially entirely etched away, in other words, down to the central layer 10 laterally of the ridge. The disclosed layer sequence is maintained under the cladding layer 11 and under the first contact 14, but the layer thickness is decreased so that laterally from the ridge the limitation of the emission into the ridge region is improved.

Regarding the specific layer thicknesses, it can be stated that the limitation of the emission to the ridge region is increased when the sum of the thicknesses of the tuning layer 9, the central layer 10 and the active layer 6 is optimally small as shown in Table 1 which shows a value of a maximum 0.9 $\mu$m for this thickness. A tuning layer, of course, cannot be excessively thin if effective tuning is to be obtained.

The central layer 10 is produced so as to be as thin as possible. The doping must be high enough so as to assure high conductivity. The minimum thickness is limited by the manufacturing processes utilized. Holes which interrupt the central layer 10 must not be present. The lower limit of 0.02 $\mu$m for the thickness and the upper limit of $20^{20}$ cm$^{-3}$ for the doping level which are given in Table 1 represent the present state of the art. Lower values for the thicknesses and higher values for the doping of the central layer would be advantageous for the invention.

The quasi-index discontinuity at the edge of the ridge corresponding tot he MCRW principle must be greater the narrower the ridge and, thus, the narrower the intended emission limitation and this requires adequately small spacing of the layers that carry the emission (which are the tuning layer 9 and the active layer 6) from the surface or the boundary surface to the cladding layer 11 and, thus, these layers must be adequately thin. As a compromise, the active layer 6 is kept optimally thin so as to maintain a thickness for the tuning layer 9 that is adequate for effective tuning.

Table 1 gives the parameters for the various layers. Table 1 is directed to exemplary embodiments using InP material where Q denotes quaternary material. The abbreviations utilized in Table 1 are ch, chemical composition; c, conductivity type; $\lambda_g$; wavelength; d, doping level; th, layer thickness. Then numbers 1 and 2 placed in parenthesis after the different columns refer to limits which are advantageously observed or to an especially advantageous exemplary embodiment. Table 2 gives the parameters for the lattice layers 8 and 80 for the five alternative embodiments.

tuning layer (9, 90) and said first contact (14) is applied onto said first contact layer, a ridge waveguide (11, 12, 13) formed according to MCRW principle above said strip-shaped region, said ridge waveguide formed by a strip-shaped cladding layer (11), a second contact layer (12) which is applied thereon and by a contact strip (13) of metal which is applied onto said second contact layer, said second contact (15) applied onto said contact strip (13), said third contact (16) is situated on that side of said barrier layer (4) which is opposite to said second contact (15), said cladding layer (11) and said second contact layer (12) doped for a first electrical conductivity type, and said tuning layer (9, 90), said first contact

TABLE 1

| Layer No. | ch | c | $\lambda_g/\mu m$ (1) | $d/10^{18}cm^{-3}$ (1) | $th/\mu m$ (1) | $\lambda_g/\mu m$ (2) | $d/10^{18}cm^{-3}$ (2) | $th/\mu m$ (2) |
|---|---|---|---|---|---|---|---|---|
| 2 | InP | p | 0.92 | 5 | 50 ... 200 | 0.92 | 5 | 80 |
| 3 | InP | p | 0.92 | 0.1 ... 5 | 0.5 ... 10 | 0.92 | 1 | 5 |
| 4 | Q | n | 1.00 ... 1.67 | 1 ... 50 | 0.05 ... 1 | 1.30 | 10 | 0.3 |
| 41 | Q | n | 1.00 ... 1.67 | 1 ... 50 | 0.05 ... 0.5 | 1.30 | 10 | 0.15 |
| 42 | InP | n | 0.92 | 1 ... 50 | 0.05 ... 0.5 | 0.92 | 10 | 0.15 |
| 43 | InP | p | 0.92 | 0.1 ... 5 | 0.05 ... 0.5 | 0.92 | 0.5 | 0.15 |
| 5 | InP | p | 0.92 | 0.1 ... 5 | 0.1 ... 5 | 0.92 | 0.3 | 1 |
| 6 | Q | — | 1.30 ... 1.67 | — | 0.05 ... 0.2 | 1.55 | — | 0.1 |
| 7 | Q | — | 1.00 ... 1.67 | — | 0.01 ... 0.1 | 1.30 | — | 0.03 |
| 81 | Q | p | 1.00 ... 1.67 | 0.1 ... 5 | 0.05 ... 0.5 | 1.15 | 0.5 | 0.1 |
| 9 | Q | n | 1.00 ... 1.67 | 0.05 ... 5 | 0.1 ... 0.5 | 1.40 | 0.2 | 0.2 |
| 95 | Q | n | 1.00 ... 1.67 | 2 ... 100 | 0.02 ... 0.5 | 1.15 | 20 | 0.1 |
| 10 | InP | n | 0.92 ... | 2 ... 100 | 0.02 ... 0.2 | 0.92 | 20 | 0.15 |
| 11 | InP | p | 0.92 | 0.1 ... 5 | 0.5 ... 5 | 0.92 | 0.5 | 1.5 |
| 12 | Q | p | 1.00 ... 1.67 | 0.5 ... 50 | 0.05 ... 0.5 | 1.30 | 5 | 0.2 |

TABLE 2

Parameters, Layer No. 8, 80 Possible (1), Typical (2)

| Alternative | ch | c | $\lambda_g/\mu m$ (1) | $d/10^{18}cm^{-3}$ (1) | $th/\mu m$ (1) | $\lambda_g/\mu m$ (2) | $d/10^{18}cm^{-3}$ (2) | $th/\mu m$ (2) |
|---|---|---|---|---|---|---|---|---|
| 1 | InP | n | 0.92 | 2 ... 100 | 0.05 ... 0.5 | 0.92 | 20 | 0.15 |
| 2 | Q | p | 1.00 ... 1.67 | 0.1 ... 10 | 0.05 ... 0.5 | 1.15 | 0.5 | 0.15 |
| 3 | InP | p | 0.92 | 0.1 ... 10 | 0.05 ... 10 | 0.92 | 1 | 5 |
| 4 | Q | p | 1.00 ... 1.67 | 0.05 ... 5 | 0.05 ... 0.5 | 1.15 | 0.2 | 0.15 |
| 5 | Q | n | 1.00 ... 1.67 | 0.05 ... 5 | 0.01 ... 0.5 | 1.15 | 0.2 | 0.05 |

It is seen that this invention provides an improved tunable semiconductor laser and although the invention has been described with respect to preferred embodiments, it is not to be so limited as changes and modifications can be made which are within the full intended scope of the invention as defined by the appended claims.

We claim as our invention:

1. A tunable semiconductor laser comprising a substrate upon which are arranged an active layer in which a laser cavity is formed, a tuning layer, and a first contact, a second contact, and a third contact, said active layer (6) and said tuning layer (9, 90) formed as a sandwich, a central layer (10) of semiconductor material which is a current conductor is grown between said active layer (6) and said tuning layer (9, 90), said central layer (10) has such a thickness and so high a doping concentration as to provide the required minimum charge carrier density and electrical conductivity for said central layer (10), a barrier layer (4) which is interrupted by a stripe-shaped region is provided for a lateral limitation of the current conduction to this stripe-shaped region; said tuning layer (9, 90) is arranged on said barrier layer (4) which faces away from substrate, a first contact layer (95, 950) is applied onto said layer (95, 950), said central layer (10) and at least layered portions of said barrier layer (4) are doped for a second opposite electrical conductivity type.

2. A semiconductor laser according to claim 1, wherein a buffer layer (3), said barrier layer (4) and a balancing or compensating layer (5,50) which causes said barrier layer (4) to be planar are successively grown onto said substrate (2), said buffer layer (3) and said balancing or compensating layer (5) are doped for said first electrical conductivity type, and a protective layer (7) is grown on said active layer (6) on the side which faces away from said substrate (2).

3. A semiconductor laser according to claim 2, wherein a lattice layer (8) which has a DFB lattice is formed between said barrier layer (4) and said balancing or compensating layer (50).

4. A semiconductor laser according to claim 2, wherein said buffer layer (3) contains a DFB lattice at least in the region of said ridge waveguide.

5. A semiconductor laser according to claim 2, wherein a lattice layer (8) which has a DFB lattice is formed between said balancing or compensating layer (5) and said ridge waveguide.

6. A semiconductor laser according to claim 1 wherein said first electrical conductivity type is p-conduction and said second electrical conductivity type is n-conduction.

7. A semiconductor laser according to claim 1 wherein said first conductivity type is n-conduction and said second conductivity type is p-conduction.

8. A semiconductor laser according to claim 1 wherein said central layer (10) contains a DFB lattice.

9. A semiconductor laser according to claim 1 wherein said active layer (6) is grown above said tuning layer (9).

10. A semiconductor laser according to claim 1 wherein said tuning layer (90) is grown above said active layer (6).

11. A semiconductor laser according to claim 1 wherein a passivation layer (17) composed of a dielectric is formed under said first contact (14) and said second contact (15); and said passivation layer (17) leaves free regions provided for making contact on said first contact layer (95, 950) and on said contact strip (13).

12. A semiconductor laser according to claim 1 wherein said substrate (2) is doped for electrical conduction of said first conductivity type; and said third contact (16) is applied on the free regions of said substrate (2).

13. A semiconductor laser according to claim 2 wherein said central layer (10) contains a DFB lattice.

14. A semiconductor laser according to claim 2 wherein said active layer (6) is grown above said tuning layer (9).

15. A semiconductor laser according to claim 2 wherein said tuning layer (90) is grown above said active layer (6).

16. A semiconductor laser according to claim 2 wherein a passivation layer (17) composed of a dielectric is formed under said first contact (14) and said second contact (15); and said passivation layer (17) leaves free regions provided for making contact on said first contact layer (95, 950) and on said contact strip (13).

17. A semiconductor laser according to claim 2 wherein said substrate (2) is doped for electrical conduction of said first conductivity type; and said third contact (16) is applied on the free regions of said substrate (2).

18. A tunable semiconductor laser comprising a substrate, an active layer in which a laser cavity is formed, a tuning layer, a first contact, a second contact, and a third contact, said active layer and said tuning layer being arranged above one another, said active layer and said tuning layer being separated by a central layer of semiconductor material, said central layer being designed as an electrical conductor, said central layer being so thick and so highly doped that required minimum values of charge carrier density and electrical conductivity within said central layer are secured, a barrier layer interrupted by a stripe-shaped region being provided for a lateral confinement of the electrical current to said stripe-shaped region, said tuning layer being situated on that side of said barrier layer which faces away from said substrate, a first contact layer being applied onto said tuning layer, said first contact being applied onto said first contact layer, a ridge waveguide being formed according to MCRW principle above said stripe-shaped region interrupting said barrier layer, said ridge waveguide being formed by a stripe-shaped cladding layer, by a second contact layer being applied onto said cladding layer, and by a contact strip of metal being applied onto said second contact layer, said second contact being applied onto said contact strip, said third contact being situated on that side of said barrier layer which faces away from said second contact, said cladding layer and said second contact layer being doped for a first electrical conductivity type, and said tuning layer, said first contact layer, said central layer, and at least layered portions of said barrier layer being doped for an opposite second electrical conductivity type.

19. A semiconductor laser according to claim 18, wherein a buffer layer (3), said barrier layer (4) and a balancing or compensating layer (5,50) which causes said barrier layer (4) to be planar are successively grown onto said substrate (2), said buffer layer (3) and said balancing or compensating layer (5) are doped for said first electrical conductivity type, and a protective layer (7) is grown on said active layer (6) on the side which faces away from said substrate (2).

20. A semiconductor laser according to claim 19, wherein a lattice layer (8) which has a DFB lattice is formed between said barrier layer (4) and said balancing or compensating layer (50).

21. A semiconductor laser according to claim 19, wherein said buffer layer (3) contains a DFB lattice at least in the region of said ridge waveguide.

22. A semiconductor laser according to claim 19, wherein a lattice layer (80) which has a DFB lattice is formed between said balancing or compensating layer (5) and said ridge waveguide.

23. A semiconductor laser according to claim 18 wherein said first electrical conductivity type is p-conduction and said second electrical conductivity type is n-conduction.

24. A semiconductor laser according to claim 18 wherein said first conductivity type is n-conduction and said second conductivity type is p-conduction.

25. A semiconductor laser according to claim 18 wherein said central layer (10) contains a DFB lattice.

26. A semiconductor laser according to claim 18 wherein said active layer (6) is grown above said tuning layer (9).

27. A semiconductor laser according to claim 18 wherein said tuning layer (90) is grown above said active layer (6).

28. A semiconductor laser according to claim 18 wherein a passivation layer (17) composed of a dielectric is formed under said first contact (14) and said second contact (15); and said passivation layer (17) leaves free regions provided for making contact on said first contact layer (95, 950) and on said contact strip (13).

29. A semiconductor laser according to claim 18 wherein said substrate (2) is doped for electrical conduction of said first conductivity type; and said third contact (16) is applied on the free regions of said substrate (2).

* * * * *